(12) United States Patent
Shang (10) Patent No.: US 8,887,527 B2
(45) Date of Patent: Nov. 18, 2014

(54) FOAMING PROCESS FOR PREPARING WAFER-LEVEL GLASS MICRO-CAVITIES

(75) Inventor: Jintang Shang, Jiangsu (CN)

(73) Assignee: Southeast University, Jiangsu (CN)

( * ) Notice: Subject to any disclaimer, the term of this patent is extended or adjusted under 35 U.S.C. 154(b) by 331 days.

(21) Appl. No.: 13/526,179

(22) Filed: Jun. 18, 2012

(65) Prior Publication Data

US 2012/0285198 A1 Nov. 15, 2012

Related U.S. Application Data

(63) Continuation-in-part of application No. PCT/CN2010/079785, filed on Dec. 14, 2010.

(30) Foreign Application Priority Data

Dec. 18, 2009 (CN) .......................... 2009 1 0263297
Jan. 22, 2010 (CN) .......................... 2010 1 0100938

(51) Int. Cl.
*C03B 19/08* (2006.01)
*B81B 7/02* (2006.01)
*B81B 7/00* (2006.01)

(52) U.S. Cl.
CPC .............. *C03B 19/08* (2013.01); *B81B 7/0051* (2013.01)
USPC .............................................. 65/21.4; 65/46

(58) Field of Classification Search
CPC .. C03C 11/002; C03C 11/007; C03B 19/107; H01L 2924/00; H01L 2924/10253
USPC ........................................... 438/455; 65/21.2
See application file for complete search history.

(56) References Cited

U.S. PATENT DOCUMENTS

| | | | | |
|---|---|---|---|---|
| 4,303,732 A | * | 12/1981 | Torobin | 428/333 |
| 4,693,739 A | * | 9/1987 | Manabe et al. | 65/21.4 |
| 6,531,222 B1 | * | 3/2003 | Tanaka et al. | 428/402 |
| 6,808,956 B2 | | 10/2004 | Cabuz et al. | |
| 6,934,063 B2 | | 8/2005 | Ton | |
| 8,198,812 B1 | * | 6/2012 | Wenzlaff et al. | 313/583 |
| 8,513,887 B1 | * | 8/2013 | Wedding et al. | 313/582 |
| 8,631,702 B2 | * | 1/2014 | Horning et al. | 73/504.13 |
| 2002/0004111 A1 | * | 1/2002 | Matsubara et al. | 428/34.4 |

(Continued)

FOREIGN PATENT DOCUMENTS

| | | |
|---|---|---|
| CN | 101157435 | 4/2008 |
| CN | 101172303 | 5/2008 |
| CN | 101259951 | 9/2008 |
| CN | 101734612 | 6/2010 |

OTHER PUBLICATIONS

Eklund et al., "Glass Blowing on a Wafer Level", Journal of Microelectromechanical Systems, Apr. 2007, 16(2):232-239.

*Primary Examiner* — Jodi C Franklin
(74) *Attorney, Agent, or Firm* — Christensen Fonder P.A.

(57) ABSTRACT

A foaming process for preparing wafer-level glass microcavities that include, etching silicon trenches on a Si wafer through Si micro-machining process; placing high-temperature outgassing agent in the silicon trenches; bonding the Si wafer with a piece of glass wafer by anodic bonding to form sealing cavities; heating up the bonded wafer, and holding the temperature the high-temperature outgassing agent such that the molten glass corresponding to the sealing cavities deforms and structures corresponding to the silicon trenches are formed in the glass; cooling down to obtain wafer-level glass micro-flow channels.

9 Claims, 3 Drawing Sheets

(56) References Cited

U.S. PATENT DOCUMENTS

| | | | |
|---|---|---|---|
| 2007/0071922 A1* | 3/2007 | Eklund et al. | 428/34.6 |
| 2008/0280124 A1* | 11/2008 | Eklund et al. | 428/315.9 |
| 2009/0038797 A1* | 2/2009 | Skala et al. | 166/280.1 |
| 2011/0198721 A1* | 8/2011 | Yang et al. | 257/506 |
| 2012/0285198 A1* | 11/2012 | Shang | 65/22 |
| 2014/0138351 A1* | 5/2014 | Mancarella et al. | 216/37 |

* cited by examiner

FOAMING PROCESS FOR PREPARING WAFER-LEVEL GLASS MICRO-CAVITIES

RELATED APPLICATION

This application is a continuation-in-part of PCT Application No. PCT/CN2010/079785 filed Dec. 14, 2010, which claims the priority to China Patent Application No. CN200910263297.X, filed Dec. 18, 2009, and China Patent Application No. CN201010100938.2, filed Jan. 22, 2010, each of which is hereby fully incorporated herein by reference.

FIELD OF THE INVENTION

The present invention relates to a micro-system manufacturing technique, in particular to a foaming process for preparing wafer-level glass micro-cavities.

BACKGROUND OF THE INVENTION

Pyrex7740 glass (a kind of glass that contains alkali ions, wherein Pyrex is a product brand of Corning Inc.) has a thermal expansion coefficient close to that of silicon material, high light transmittance and high strength, and can form a high-strength bonding connection with Si substrate through an anodic bonding process; in that way, on the bonding surface robust Si—O covalent bonds are formed, the strength of which is even higher than that of the Si material itself. With such features, Pyrex7740 glass is widely applied in MEMS encapsulation, microfluid and MOEMS (Micro-Optical-Electromechanical System) fields, etc. Glass micro-cavity structure has important applications in production and encapsulation of MEMS elements and production of microfluidics elements. However, micro-machining of glass is extremely difficult. At present, there are several machining processes available, such as sand blasting, ECDM, wet etching, dry etching, and laser drilling. Glass machined through the above machining processes usually has a high surface roughness; in addition, the above machining processes usually have a low machining speed and a high process cost.

Another machining process is negative pressure thermoforming process. The negative pressure molding process disclosed in Chinese Patent Application No. 200710190226.2 comprises the following steps: etching an Si trench on silicon; bonding glass to the silicon by anodic bonding in a vacuum; heating them in the air to a high temperature and forcing the glass into the silicon cavity under negative pressure between the exterior and interior of the cavity, so as to form glass micro-cavity structures on the back. Since micro flow channels are formed on the back of the glass wafer in the negative pressure molding process, the height of the micro-cavities formed on the back is small (not greater than the thickness of the glass wafer) when the glass wafer is thicker. To obtain glass micro-cavities with a high height, the silicon mold must have cavities with a high depth-width ratio, so as to provide more space for glass deformation.

Another process is a self-inflation process. This process comprises the following steps: bonding glass with silicon under one bar, and utilizing sealed gas as the driving force to accomplish thermoforming of the glass. Since the process requires enough gas to provide enough driving force for self-inflation and thereby form higher glass micro-cavities, unusually deep pores with high depth-width ratio have to be etched on the silicon, and sometimes even a non-standard thicken silicon wafer is required (sometimes, the required thickness is 900 μm or above; see Glass Blowing on a Wafer Level, JOURNAL OF MICROELECTROMECHANICAL SYSTEMS, VOL. 16, NO. 2, APRIL 2007); as a result, the process time will be increased significantly, the cost of the dry etching process will be very high, the material cost will be increased significantly, and thereby the total cost will be increased. To provide a further driving force for molding so as to form spherical glass micro-cavities with a higher height, another piece of silicon wafer with pore structures has to be bonded; consequently, the cost will be increased, and the additional bonding process may cause silicon wafer wrap and thereby decrease the rate of finished products. Another drawback of the above process is: if a complex microfluid system is to be formed, large-area dry etching is required, which will cause higher cost; in addition, when flow channels and cavities in different sizes are molded, it is difficult to form cavities with different heights on a silicon wafer through dry etching, thus the gas supply is insufficient when molding complex glass structure.

SUMMARY OF THE INVENTION

The object of the present invention is to provide a low-cost foaming process for preparing wafer-level glass micro-cavities with a high height and uniform size.

An embodiment of the claimed invention comprises a foaming process for preparing wafer-level glass micro-cavities that includes the following steps:

Step 1: etching silicon trenches with a depth of 10-200 μm and a depth-width ratio of <2 on a silicon wafer through silicon micro-machining process, Step 2: placing appropriate amount of powder of high-temperature outgassing agent in the silicon trench, Step 3: bonding a piece of glass wafer to the above silicon wafer by anodic bonding in air or vacuum, thus the silicon trenches become sealing cavities, Step 4: heating the silicon wafer bonded with the glass wafer in the air to 820° C.-890° C., and holding the temperature for 3-5 min, so that the high-temperature outgassing agent releases gas because of heating and thereby positive pressure is created, and the molten glass corresponding to the sealing cavities deforms and thereby glass micro-cavity structure corresponding to the silicon trench is formed on the glass; after cooling, wafer-level glass micro-cavities are obtained.

In the above embodiment, the silicon trenches are silicon micro-flow channels, or separate silicon trench arrays, or a silicon trench array connected by micro-flow channels. In the case that the silicon trenches are silicon micro-flow channels, the high-temperature outgassing agent is usually placed at the ends of the silicon flow channels, and thereby the obtained glass micro-structures will be glass micro-channels; in the case that the silicon trenches are separate from each other, the powder of the high-temperature outgassing agent is placed in each trench, and thereby a plurality of independent spherical glass micro-cavities will be formed; in the case that the silicon trenches are silicon trench arrays connected by micro-flow channels, spherical glass micro-cavity arrays connected by micro-flow channels will be formed, and, in that case, since the silicon trenches are connected by micro-flow channels, all connected cavities have uniform gas pressure in the thermoforming process, and therefore the obtained spherical glass micro-cavities have good dimensional uniformity.

In the above embodiment, the high-temperature outgassing agent is calcium carbonate, titanium hydride, magnesium carbonate, strontium carbonate, titanium hydride, or zirconium hydride. Since the gas released from these materials is very little at a temperature lower than 400° C., the bonding quality will not be affected by the gas released in the bonding process. The decomposition temperature of calcium carbonate powder is close to the heating temperature of glass thermoforming; in addition, the molecules of carbon dioxide gas decomposed from calcium carbonate are too large to escape through the clearance of glass; therefore, it is easier to control the decomposition amount when calcium carbonate is used as the high-temperature outgassing agent, and thus the obtained glass micro-cavities have good dimension uniformity; since titanium hydride powder can be machined to very fine granularity, it can be placed into the silicon trenches easily, and therefore is more suitable for producing smaller glass micro-cavities.

In the above embodiment, the silicon trenches on the Si wafer preferably have a depth of 50-100 μm and a depth-width ratio of <1. Since the time required to etch the silicon trenches with such depth and such depth-width ratio is relatively short, a wet etching process can be used to achieve the object, and the cost is reduced; moreover, since micro-trenches with such depth and such depth-width ratio still have enough space to accommodate a large quantity of high-temperature outgassing agent, enough driving force can still be created to get a high height for the glass micro-cavities.

In an embodiment, the process conditions for anodic bonding between the Si wafer and Pyrex7740 glass are: temperature: 400° C., voltage: 600V. Under those conditions, glass and silicon can be bonded firmly to each other, and the spaces can be sealed tightly; therefore, no gas leakage will occur during the heating process.

In an embodiment, the powder of high-temperature outgassing agent can be placed into the silicon trenches with the following method: mix the powder of high-temperature outgassing agent with a volatile solvent, add the mixture into the silicon trenches, and then remove the solvent by drying. An advantage of that method is: the powder will not be exposed to air directly and therefore will not contaminate the silicon wafer and other elements before bonding.

The silicon trenches are silicon trench arrays connected by micro-channels (directly etched on the silicon), and the powder of high-temperature outgassing agent is placed in one or more silicon trenches. The advantages of such an arrangement include: since the silicon trenches are connected by micro-channels, the connected trenches have uniform gas pressure during the thermoforming process; therefore, the formed spherical glass micro-cavities have good dimensional uniformity; moreover, since the trenches are connected by micro-channels, the gas can flow freely; therefore, the glass corresponding to the connected trenches can be hot formed by placing the powder of high temperature outgassing agent in some of the silicon trenches, rather than placing the powder of high-temperature outgassing agent in all of the silicon trenches.

In the above embodiment, the diameter of the micro-channels is smaller than the diameter of the powder of high-temperature outgassing agent. An advantage of such an arrangement is: the gas can pass through the micro-channels while the powder with larger diameter cannot pass; therefore, the powder of high-temperature outgassing agent in a certain silicon trench cannot enter into any other silicon cavity through the micro-channels, avoiding potential powder contamination to the other silicon trenches.

The claimed invention has the following beneficial effects:

1. Embodiment of the claimed invention are based on the conventional MEMS machining process. Silicon trench structures are etched on a Si wafer, and a high-temperature outgassing agent is filled in the shallow trench; then, a Pyrex7740 glass wafer is covered on the shallow trench through anodic bonding process to form a sealing micro-cavity; next, the glass is heated up to a molten state, the pressure in the sealing cavity is increased as gas is released from the high-temperature outgassing agent, and thereby the molten glass corresponding to the silicon trenches with round or square (planar shape) openings forms spherical structures, and the molten glass corresponding to the silicon micro-flow channel forms cylindrical glass micro-flow channel structures against the silicon micro-channels. The high-temperature outgassing agent serves as a gas source for molding of glass micro-flow channels, and has the following characteristics: it can supply enough gas to form various micro-structures; the cost is low; the method is simple, the molding height is high (if enough high-temperature outgassing agent is added, the spherical cavities can be cavities with capacity greater than hemisphere, and the micro-flow channel can have a cross section greater than hemicycle); the sphericity is good; the inner and outer walls of the glass micro-cavities obtained by thermoforming are very smooth, for example, the roughness of inner wall can be lower than 1 nm ($R_{ms}$), and the roughness of the outer wall can be lower than 10 nm ($R_{ms}$); therefore, the micro-flow channels have low flow resistance and high light transmittance. In the present invention, shallow silicon trenches can be etched on the silicon wafer through a low-cost wet etching process, and then high-temperature outgassing agent can be filled into the silicon trenches partially; therefore, the process is simple and inexpensive.

2. After the high-temperature foaming process of the claimed invention is completed, the contaminated areas can be removed through a scribing process, and at the same time the fluid inlet and outlet are opened. In the claimed invention, the high-temperature outgassing agent only needs to be placed in the silicon trench arrays connected by micro-flow channels or the silicon micro-flow channels partially; in that case, the gas released in the thermoforming process can be used in the foaming of all micro-flow channels, while the powder still remains locally; thus, the contamination of residuals to the MEMS micro-flow channels or other glass micro-cavities can be avoided.

3. In embodiments of the claimed invention, the silicon trenches can be etched on the silicon through a wet etching process; therefore, the cost can be reduced. In the prior art, dry etching process is adopted to obtain silicon cavities with high depth and high depth-width ratio, so as to provide enough gas. In the prior art, it takes a long time at a high cost to etch silicon cavities which are deeper or have a larger area. However, since the low-cost and mature wet etching process is used in embodiments of the claimed invention, the shallow trenches can be etched with low cost and high efficiency.

4. In embodiments of the claimed invention, calcium carbonate powder is used as the high-temperature outgassing agent. Calcium carbonate powder will decompose in large amounts at temperatures above 800° C., which closely matches the glass melting temperature; at temperatures lower than 800° C., only a small amount of calcium carbonate will decompose; therefore, before the foaming of the glass, the sealing glass cavities will not rupture due to high gas pressure. When the temperature is higher than 800° C., a large amount of calcium carbonate powder will decompose and release carbon dioxide gas, and thereby the glass is moulded. In embodiments of the claimed invention, the quantity of calcium carbonate required to form glass micro-cavities with specific volume can be determined through simple calculation based on the decomposition amount of calcium carbonate. With the corrected reaction rate equilibrium formula $$K_c = A_c T^{-1} \exp\left(-\frac{E_c}{R'T}\right),$$

the internal pressure can be controlled accurately, and the cross sections of the glass micro-flow channels can be adjusted as required according to different flow rates. Therefore, the process is simple, reliable, and can be widely applied.

5. In embodiments of the claimed invention, titanium hydride powder can be used as high-temperature outgassing agent. Since titanium hydride can be made into powder at very fine granularity, the silicon trenches that accommodate the titanium hydride powder can be smaller in size and volume; therefore, glass micro-structures with smaller volume can be obtained.

6. As the titanium hydride powder required for the foaming of a single glass micro-cavity is only tens of micrograms or even several micrograms, it is difficult to weigh. In the claimed invention, a small amount of powder may be mixed with a large volume of volatile solvent such as water, alcohol, or acetone to form homogeneously mixed solution, and then a certain volume of the solution is taken and placed in the flow channels, so as to accurately control the volume of powder, and thereby facilitate accurate control of the volume of glass micro-cavities; on the other hand, the contamination of the silicon wafer or other elements resulting from direct exposure of the powder is avoided.

7. In embodiments of the claimed invention, sealing cavities are formed by means of anodic bonding, which has high bond strength and can achieve good sealing performance. Si—O bonds are formed in the bonding area, and these chemical bonds still have high strength even at high temperature; such that leakage causing thermoforming failure rarely occurs during the heating process. Under the bonding conditions of 400° C. temperature and 600V DC voltage, anodic bonding can achieve a better bond sealing effect. The stress created in the Pyrex7740 glass during the high-temperature positive pressure foaming process can be eliminated effectively through an annealing process, and thereby the strength and toughness of the glass wafer can be improved.

8. In embodiments of the claimed invention, Pyrex7740 glass that has a thermal expansion coefficient equivalent to that of silicon is used to form glass micro-cavity structures; therefore, the bonded wafer will not be damaged due to thermal mismatch.

9. The etched silicon trenches of the claimed invention are connected by micro-channels; during thermoforming, the gas released from the high-temperature outgassing agent can reach each of the sealing cavities through the micro-channels; therefore, the pressure in the sealing cavities is more uniform, and the formed glass micro-cavities have good dimensional uniformity.

In embodiments of the claimed invention, the diameter of the micro-channels is smaller than the particle diameter of the powder; thus, the powder of high-temperature outgassing agent and decomposition product thereof in each sealing cavity cannot enter into any other cavity, and the powder contamination to other cavities can be avoided.

BRIEF DESCRIPTION OF THE DRAWINGS

The invention can be understood in consideration of the following detailed description of various embodiments of the invention in connection with the accompanying drawings, in which.

DETAILED DESCRIPTION OF THE DRAWINGS

In a first embodiment of the claimed invention, a foaming process for preparing wafer-level glass micro-cavities, comprises the following steps:

Step 1: etching silicon trenches on a Si wafer (e.g., 4" wafer) through an Si micro-machining process, wherein, the silicon wafer can have a standard thickness, or can be thinner (e.g., 300 μm) or thicker (e.g., 600 μm). For example, the silicon wafer may have a thickness of 500 μm; the silicon trenches have a depth of 10-200 μm, e.g., 15 μm, 30 μm, 40 μm, 60 μm, 95 μm, 132 μm, 150 μm, 180 μm, 200 μm, preferably 50-100 μm; the depth-width ratio of etching is smaller than 2, for example, the depth-width ratio of etching is 1.5, 1, 0.8, 0.5, 0.2, 0.1, 0.05, or 0.02; the pattern structures on the Si wafer are formed through a wet etching process, or a dry inductively coupled plasma (ICP) etching process, or a reactive ion etching process, preferably through the low-cost wet etching process that employs TMAH (tetramethylammonium hydroxide) solution; the patterns can be square or circular trench arrays, which are separated from each other without connection; or, the patterns can be composed of silicon flow channels in an appropriate size; or, the patterns can be composed of square or circular trenches connected by silicon micro-channels, and the width of square trenches or the diameter of circular trenches can be different from the width of the silicon micro-channels, and moreover, the square or circular trenches can have different widths or diameters;

Step 2: placing an appropriate amount of high-temperature outgassing agent in the silicon trenches, wherein, the amount of high-temperature outgassing agent is calculated according to the size of the silicon trenches and the volume of glass micro-cavities to be formed, such that the volume of gas released from the high-temperature outgassing agent is greater than or equal to the sum of the volume of silicon trenches and the volume of glass micro-cavities. The high-temperature outgassing agent is an outgassing agent that releases gas at a temperature higher than 500° C., such as calcium carbonate (chemically pure calcium carbonate (99 wt %) with fine granularity can be used), magnesium carbonate, strontium carbonate, titanium hydride, or zirconium hydride. As the amount of high-temperature outgassing agent is very small (calculated in micrograms), the high-temperature outgassing agent can be mixed with volatile solvent (e.g., water, alcohol, acetone, or isopropanol, etc.), and the mixed liquid can be added into the silicon trenches in an appropriate volume, and then dried; the mixed liquid can be added into the silicon micro-trenches one or more times, and dried after each addition, till the amount of the high-temperature outgassing agent meets the requirement;

Step 3: bonding the Si wafer with a piece of glass wafer, such as Pyrex7740 glass wafer (a brand of borosilicate glass, produced by Corning Inc. (USA), and available in the market, usually polished, having a same size as the Si wafer) by anodic bonding in air or vacuum, wherein, in case of vacuum bonding, the pressure in the vacuum environment is lower than 1 Pa, for example, the pressure is 0.5 Pa, 0.2 Pa, 0.1 Pa, 0.05 Pa, 0.01 Pa, or 0.001 Pa; through the anodic bonding process, the silicon trenches on the Pyrex7740 glass form sealing cavities; before bonding, the bonding surfaces must be kept highly clean with very low surface roughness to meet the requirement of conventional bonding, and the bonding surfaces should be cleaned and polished with a conventional method according to the requirement of anodic bonding or other bonding processes; or, the bonding can be conducted directly at pressure atmosphere, e.g., under 1 bar. However, compared with bonding under atmospheric pressure, bonding in a vacuum can achieve better bonding quality, and will not cause gas trapped in the tiny clearance between the bonding surfaces, which leads to the undesirable void defects at the bonded areas; therefore, the bonding surface under vacuum will be smoother after thermoforming compared to that bonded in air;

Step 4: heating up the bonded silicon wafer and glass wafer under 1 bar to 820° C.-890° C., and holding for 3~5 min. at the temperature; wherein, for example, the temperature can be 820° C., 830° C., 840° C., 845° C., 850° C., 855° C., 860° C., 870° C., 880° C., or 890° C., the holding time can be 3~5 min, e.g., 3.2 min, 3.5 min, 3.8 min, 4 min, 4.2 min, 4.4 min, 4.8 min; then, gas is released from the high-temperature outgassing agent in the cavities, and thereby a pressure difference is created between the exterior and interior of the cavities; consequently, spherical (corresponding to circular silicon cavities) or cylindrical (corresponding to rectangular silicon cavities) glass micro-cavities are formed in the softened glass under the driving of the pressure difference; then, cooling down to room temperature (20-25° C.), e.g., 22° C., and treating the wafer by annealing under normal pressure to eliminate stress, wherein in an embodiment, the normal pressure here refers to 1 bar; finally, removing the silicon to obtain wafer-level spherical glass micro-cavities for MEMS encapsulation or cylindrical glass micro-channels. The silicon can be removed through the corrosion of corrosive liquid such as TMAH (10 wt %) at 80° C. or with potassium hydroxide.

In the above embodiment, the Si wafer and Pyrex7740 glass are bonded through an anodic bonding process under the following conditions: temperature: 400° C., voltage: 600V. The heating temperature in step 3 is preferably 840° C.-850° C. which will yield a better result because at the temperature range, the glass has a moderate viscosity which is favorable for foaming. The thermoforming glass micro-structures can be treated by thermal annealing to eliminate stress.

In an embodiment, the conditions for thermal annealing are: annealing temperature range: 510° C.-560° C., the annealing temperature can be 520° C., 530° C., 540° C., or 550° C.; the annealing holding time can be 30 min; then, cooling down in air to room temperature (e.g., 25° C.) slowly. Before the anodic bonding process, the silicon wafer and glass wafer should be cleaned and polished according to the requirements of anodic bonding processes. In the above embodiment, the high-temperature outgassing agent is preferably calcium carbonate or titanium hydride. The micro-machining process for the shallow trenches on the Si wafer is wet etching process. The Si wafer and Pyrex7740 glass are bonded through an anodic bonding process under the following conditions: temperature: 400° C., voltage: 600V. The etched depth of the silicon trenches in step 1 is preferably within 50-100 μm, such as 75 μm, 85 μm, or 90 μm, because at this depth the high-temperature outgassing agent is easy to place, and difficult to produce contamination by contacting the glass. Ultimately, the obtained wafer-level spherical glass micro-cavity array can be aligned with a silicon wafer with MEMS elements, and bonded through an anodic bonding process to encapsulate the MEMS elements, under the following conditions: temperature: 400° C., voltage: 600V.

In a second embodiment of the claimed invention, a foaming process for preparing glass micro-flow channels, comprises the following steps:

Step 1: etching silicon trenches on a Si wafer (e.g., 4" wafer) through a Si micro-machining process, wherein, the silicon wafer can have standard thickness, for example, the silicon wafer has a thickness of 500 μm; the shallow trench has a depth of 10-200 μm, e.g., 15 μm, 30 μm, 40 μm, 60 μm, 95 μm, 132 μm, 150 μm, 180 μm; the depth-width ratio is normally smaller than 2, for example, the depth-width ratio can be 1.5, 1, 0.8, 0.5, 0.2, 0.1, 0.05, or 0.02; the pattern structures on the Si wafer are formed through a wet etching process, or a dry inductively coupled plasma (ICP) etching process, or a reactive ion etching process, preferably through the low-cost wet etching process which for example employs a TMAH solution; the patterns can be bar-like or snakelike depending on the requirements;

Step 2: placing an appropriate amount of high-temperature outgassing agent in the shallow trenches of the micro-flow channels at both ends or other positions, wherein, the amount of high-temperature outgassing agent is calculated according to the size of the micro-trenches, the anticipated total volume of gas in the micro-flow channels after foaming, and the amount of the high-temperature outgassing agent is calculated according to the outgassing amount of the high-temperature outgassing agent, and the amount must ensure that the volume of gas released from the high-temperature outgassing agent is no less than the total volume of gas in the micro-flow channels after foaming. For example, if the total volume of gas in the micro-flow channels is 5 mL, the amount of the high-temperature outgassing agent must ensure that the volume of gas released from the high-temperature outgassing agent is no less than 5 mL; the high-temperature outgassing agent refers to an outgassing agent that releases gas at a temperature above 500° C., such as calcium carbonate (chemically pure calcium carbonate (99 wt %) with fine granularity can be used), magnesium carbonate, strontium carbonate, titanium hydride, or zirconium hydride; the high-temperature outgassing agent has fine granularity and is suitable for being placed in the silicon trenches, such as a granularity higher than 400 meshes, e.g., 600 meshes, 800 meshes, etc.;

Step 3: bonding the Si wafer with a piece of glass wafer, such as Pyrex 7740, (a brand of borosilicate glass, produced by Corning Inc. (USA), and available in the market, usually polished, having a same size as the Si wafer) by anodic bonding in air or vacuum, wherein, in case of vacuum bonding, the pressure in the vacuum environment is lower than 1 Pa, for example, the pressure is 0.5 Pa, 0.2 Pa, 0.1 Pa, 0.05 Pa, 0.01 Pa, or 0.001 Pa; through the anodic bonding process, the shallow trenches on the Pyrex7740 glass form sealing cavities; before bonding, the bonding surfaces must be kept highly clean with very low surface roughness to meet the requirement of conventional bonding, and the bonding surfaces should be cleaned and polished with a conventional method according to the requirement of anodic bonding or other bonding processes.

Step 4: heating up the above bonded wafer under one bar to 820° C.-890° C., and holding for 5~10 min at the temperature; wherein, for example, the temperature can be 820° C., 830° C., 840° C., 845° C., 850° C., 855° C., 860° C., 870° C., 880° C., or 890° C., the holding time can be 3~5 min; gas is released from the high-temperature outgassing agent under heat, and thereby positive pressure is created; consequently, the molten glass corresponding to the sealing cavities deforms and micro-flow channel patterns corresponding to the patterns of shallow trenches of silicon micro-flow channels are formed in the glass, and glass micro-flow channels with semispherical cross sections are formed in the glass; then, cooling down to room temperature (20-25° C., preferably 22° C.), and treating the above wafer by annealing under normal pressure to eliminate stress, wherein, in an embodiment, the normal pressure here refers to one bar;

Finally, removing both ends of the micro-flow channels by laser scribing to form a fluid inlet and outlet, wherein, as the high-temperature outgassing agent is usually placed at both ends of the micro-flow channels, the high-temperature outgassing agent will be removed as the inlet and outlet are formed. Such a method is simple and has low cost.

In the above embodiment, the high-temperature outgassing agent may be calcium carbonate powder. Both ends of the above micro-flow channels are removed by a laser scribing method which comprises the following steps: first, etch micro-trenches with laser on the surface of silicon wafer bonded to the glass wafer; then, bend the bonded wafer to break the wafer along the micro-trenches on the surface of silicon wafer, so as to expose the inlet and outlet of the micro-flow channels; next, fill solvent into the micro-flow channels to remove the residual high-temperature outgassing agent. The micro-machining process for the shallow trenches on the Si wafer may be a wet etching process. The process conditions for anodic bonding between Si wafer and Pyrex7740 glass are: temperature: 400° C., voltage: 600V. The heating temperature in step 4 is 840° C.-850° C., e.g., 845° C. The annealing conditions are: annealing temperature range: 510° C.-560° C., annealing holding time: 30 min; then, cool down to room temperature in air slowly. The silicon wafer and Pyrex7740 glass wafer should be cleaned and polished according to the requirements of anodic bonding processes. The etched depth of shallow trenches in step 1 is 50-100 µm. The etched depth of shallow trenches of micro-flow channels in step 1 is preferably 50-100 µm, e.g., 75 µm, 85 µm, or 90 µm.

In a third embodiment, a foaming process for preparing wafer-level glass micro-cavities, comprises the following steps:

Step 1: etching shallow trenches of micro-flow channels on a 4" Si wafer through a Si micro-machining process, wherein, the silicon wafer has a standard thickness of 500 µm; the depth of the shallow trenches is 60 µm; the trenches of micro-flow channels are bar-like trenches with 2 mm aperture and 3 cm length; the micro machining process for the pattern structures on the Si wafer is wet etching process which adopts 10% TMAH solution as corrosive liquid and is performed at 80° C.;

Step 2: placing in the shallow trenches chemically pure calcium carbonate powder which has a particle size of 5 µm and a mass of 30 micrograms;

Step 3: bonding the Si wafer with a piece of glass wafer, Pyrex 7740 in an embodiment, (a brand of borosilicate glass, produced by Corning Inc. (USA), and available in the market, usually polished, having same size as the Si wafer) by anodic bonding under a pressure of 0.5 Pa; through the anodic bonding process, the shallow trenches on the Pyrex7740 glass form sealing cavities; before bonding, the bonding surfaces must be kept highly clean with very low surface roughness to meet the requirement of conventional bonding, and the bonding surfaces should be cleaned and polished with a conventional method according to the requirement of anodic bonding or other bonding processes; the process conditions for the anodic bonding: temperature: 400° C., voltage: 600V Step 4: heating up the bonded wafer to 850° C. at one bar, and holding for 10 min at this temperature, so that structures corresponding to the micro-cavity pattern structures are formed in the softened glass under the pressure difference between exterior and interior of the cavities; then, cooling down to room temperature (25° C.) to obtain micro-flow channels; treating by annealing at normal pressure (one bar) to eliminate stress.

Step 5: removing the areas at both ends of the micro-flow channels that contain the high-temperature outgassing agent by wafer scriber, to form a fluid inlet and outlet. The annealing conditions in step 4 are: annealing temperature range: 510° C.-560° C. For example, the annealing temperature can be 520° C., 530° C., 540° C., or 550° C.; annealing holding time: 30 min; then, cool down to room temperature (e.g., 25° C.) in air slowly.

In a fourth embodiment, a foaming process for preparing wafer-level glass micro-cavities, comprises the following steps:

Step 1: etching shallow trenches of micro-flow channels on a 4" Si wafer through a Si micro-machining process, wherein, the silicon wafer has a standard thickness of 500 µm; the depth of the shallow trenches is 60 µm; the trenches of Si micro-flow channels are bar-like trenches with 0.3 mm width and 3 cm length; the micro machining process for the pattern structures on the Si wafer is wet etching process which adopts 10% TMAH solution as corrosive liquid and is performed at 80° C.;

Step 2: placing in the shallow trenches titanium hydride powder which has a particle size of less than 5 µm and a mass of 12 micrograms;

Step 3: bonding the Si wafer with a piece of glass wafer, Pyrex 7740 in an embodiment, (a brand of borosilicate glass, produced by Corning Inc. (USA), and available in the market, usually polished, having same size as the Si wafer) by anodic bonding under a pressure of 0.5 Pa; through the anodic bonding process, the shallow trenches on the Pyrex7740 glass form sealing cavities; before bonding, the bonding surfaces must be kept highly clean with very low surface roughness to meet the requirement of conventional bonding, and the bonding surfaces should be cleaned and polished with a conventional method according to the requirement of anodic bonding or other bonding processes; the process conditions for the anodic bonding: temperature: 400° C., voltage: 600V.

Step 4: heating up the bonded wafer to 850° C. at one bar, and holding for 10 min at this temperature, so that structures corresponding to the micro-cavity pattern structures are formed in the softened glass under the pressure difference between exterior and interior of the cavities; then, cooling down to room temperature (25° C.) to obtain micro-flow channels; treating by annealing at normal pressure (one bar) to eliminate stress.

Step 5: removing the areas at both ends of the micro-flow channels that contain the high-temperature outgassing agent by wafer scriber, to form a fluid inlet and outlet. The annealing conditions in step 4 are: annealing temperature range: 510° C.-560° C.; annealing holding time: 30 min; then, cool down to room temperature (e.g., 25° C.) in air slowly. The obtained micro-flow channel has a height (the height of the inner wall of the top of the flow channel, namely the distance from the inner wall to the glass bottom) of 0.9 mm.

In a fifth embodiment, a foaming process for preparing wafer-level glass micro-cavities, comprises the following steps:

Step 1: etching shallow trenches of micro-flow channels on a 4" Si wafer through a Si micro-machining process, wherein, the silicon wafer has a standard thickness of 500 µm; the depth of the shallow trenches is 100 µm; the Si trenches are long bar-like trenches with 1 mm width and 2 cm length; the micro machining process for the pattern structures on the Si wafer is wet etching process which adopts 10% TMAH solution as corrosive liquid and is performed at 80° C.;

Step 2: placing in the shallow trenches titanium hydride powder which has a particle size of less than 5 µm and a mass of 25 micrograms;

Step 3: bonding the Si wafer with a piece of glass wafer, Pyrex 7740 in an embodiment, (a brand of borosilicate glass, produced by Corning Inc. (USA), and available in the market, usually polished, having same size as the Si wafer) by anodic bonding in air; through the anodic bonding process, the shallow trenches on the Pyrex7740 glass form sealing cavities; before bonding, the bonding surfaces must be kept highly clean with very low surface roughness to meet the requirement of conventional bonding, and the bonding surfaces should be cleaned and polished with a conventional method according to the requirement of anodic bonding or other bonding processes; the process conditions for the anodic bonding: temperature: 400° C., voltage: 600V.

Step 4: heating up the bonded wafer to 850° C. at one bar, and holding for 4 min at this temperature, so that structures corresponding to the micro-cavity pattern structures are formed in the softened glass under the pressure difference between the exterior and interior of the cavities; then, cooling down to room temperature (25° C.), treating by annealing at normal pressure (one bar) to eliminate stress, so as to obtain glass micro-flow channels.

Step 5: removing the areas at both ends of the micro-flow channels that contain the high-temperature outgassing agent by wafer scriber, to form a fluid inlet and outlet.

In an embodiment, the annealing conditions in step 4 are: annealing temperature range: 510° C.-560° C., for example, the annealing temperature can be 550° C.; annealing holding time: 30 min; then, cool down to 25° C. in air slowly.

In a sixth embodiment, a foaming process for preparing wafer-level glass micro-cavities, comprises the following steps:

Step 1: etching shallow trenches on a 4" Si wafer through a Si micro-machining process, wherein, the silicon wafer has a standard thickness of 500 µm; the depth of the shallow trenches is 100 µm; the Si trenches are round trenches with 1 mm aperture; the micro machining process for the pattern structures on the Si wafer is a wet etching process which adopts 10% TMAH solution as corrosive liquid and is performed at 80° C.;

Step 2: placing in the shallow trenches titanium hydride powder which has a particle size of 5 µm and a mass of 5 micrograms;

Step 3: bonding the Si wafer with a piece of glass wafer, Pyrex 7740 in an embodiment, (a brand of borosilicate glass, produced by Corning Inc. (USA), and available in the market, usually polished, having same size as the Si wafer) by anodic bonding in air; through the anodic bonding process, the shallow trenches on the Pyrex7740 glass form sealing cavities; before bonding, the bonding surfaces must be kept highly clean with very low surface roughness to meet the requirement of conventional bonding, and the bonding surfaces should be cleaned and polished with a conventional method according to the requirement of anodic bonding or other bonding processes; the process conditions for the anodic bonding: temperature: 400° C., voltage: 600V.

Step 4: heating up the bonded wafer to 850° C. at one bar, and holding for 4 min at this temperature, so that structures corresponding to the micro-cavity pattern structures are formed in the softened glass under the pressure difference between the exterior and interior of the cavities; then, cooling down to room temperature (25° C.), treating the above wafer by annealing at normal pressure (one bar) to eliminate stress.

In an embodiment, the annealing conditions in step 4 are: annealing temperature range: 510° C.-560° C., for example, the annealing temperature can be 550° C.; annealing holding time: 30 min; then, cool down to 25° C. in air slowly.

The obtained glass micro-cavities can be etched with TMAH (10 wt %, in 80° C. water bath) to remove silicon, so as to obtain wafer-level glass micro-cavity arrays. The obtained wafer-level spherical glass micro-cavity array can be aligned with a silicon wafer with MEMS elements, and bonded through anodic bonding process to encapsulate the MEMS elements, under the following conditions: temperature: 400° C., voltage: 600V.

Figure 9:
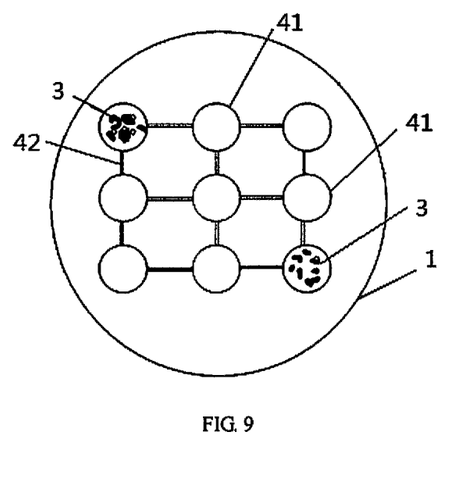
FIG. 9 is a schematic diagram of silicon trench arrays connected by micro-channels according to an embodiment of the claimed invention.

In a seventh embodiment, a foaming process for preparing wafer-level glass micro-cavities, comprises the following steps:

Step 1: etching silicon trenches 41 on a 4" Si wafer through a Si micro-machining process, wherein, the silicon channels comprise 10 circular silicon trenches 41 with 0.8 mm radius and micro-channels 42 that connect the circular silicon channels 41, and the micro-channels have a width of 5-200 µm, e.g., 6 µm or 10 µm; the silicon wafer has a standard thickness of 500 µm; the depth of the shallow trenches is 100 µm; the micro machining process for the pattern structures on the Si wafer is a wet etching process which adopts 10% TMAH solution as corrosive liquid and is performed at 80° C.;

Step 2: placing in the round trenches titanium hydride powder which has a particle size of 20 µm and a mass of 50 micrograms as follows: mix 1 mg powder with 4 mL acetone and agitate the mixed liquid to homogeneous state, and take 0.2 mL mixed liquid; add 0.02 µl mixed liquid into the silicon trench each time; after the acetone dries, add another drop of the mixed liquid, and on and on, till 0.2 mL mixed liquid is added into the silicon trenches completely;

Step 3: bonding the Si wafer with a piece of glass wafer, Pyrex 7740, in an embodiment (a brand of borosilicate glass, produced by Corning Inc. (USA), and available in the market, usually polished, having same size as the Si wafer) by anodic bonding in air; through the anodic bonding process, the shallow trenches on the Pyrex7740 glass form sealing cavities; before bonding, the bonding surfaces must be kept highly clean with very low surface roughness to meet the requirement of conventional bonding, and the bonding surfaces should be cleaned and polished with a conventional method according to the requirement of anodic bonding or other bonding processes; the process conditions for the anodic bonding: temperature: 400° C., voltage: 600V.

Step 4: heating up the bonded wafer to 850° C. at one bar, and holding for 4 min at this temperature, so that structures corresponding to the micro-cavity pattern structures are formed in the softened glass under the pressure difference between the exterior and interior of the cavities; then, cooling down to room temperature (25° C.), treating above wafer by annealing at normal pressure (one bar) to eliminate stress.

In an embodiment, the annealing conditions in step 4 are: annealing temperature range: 510° C.-560° C., for example, the annealing temperature can be 550° C.; annealing holding time: 30 min; then, cool down to 25° C. in air slowly. Finally, the spherical glass micro-cavity structure connected by glass micro-flow channels is obtained.

The obtained glass micro-cavities can be etched with TMAH (10 wt %, in 80° C. water bath) to remove silicon, so as to obtain wafer-level glass micro-cavity arrays. The obtained wafer-level spherical glass micro-cavity array can be aligned with a silicon wafer with MEMS elements, and bonded through anodic bonding process to encapsulate the MEMS elements, under the following conditions: temperature: 400° C., voltage: 600V.

Figure 1:
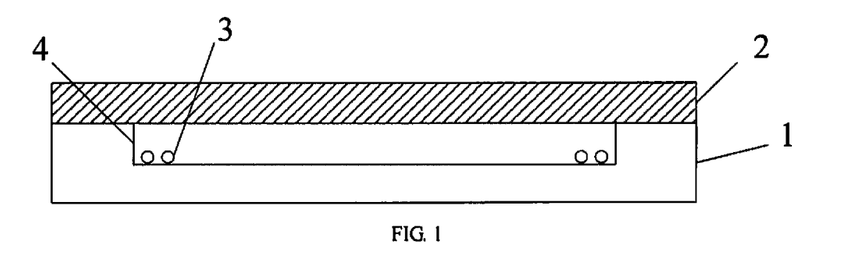
FIG. 1 is a schematic diagram of the cross section of a bonded wafer with etched shallow micro-flow channels according to an embodiment of the claimed invention.
Figure 2:
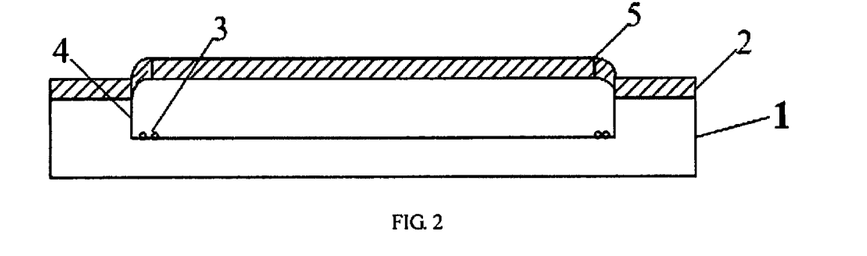
FIG. 2 is a schematic diagram of the cross section of the thermoforming glass micro-flow channel according an embodiment of the claimed invention.
Figure 3:
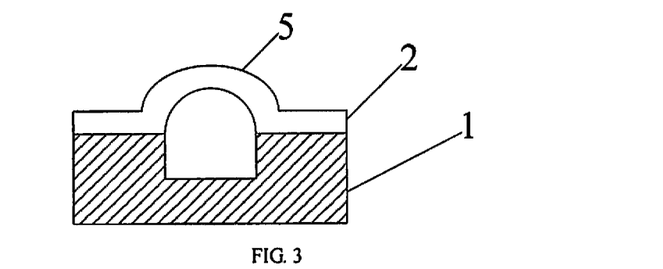
FIG. 3 is a schematic diagram of the longitudinal section of the thermoforming glass micro-flow channel according to an embodiment of the claimed invention.
Figure 4:
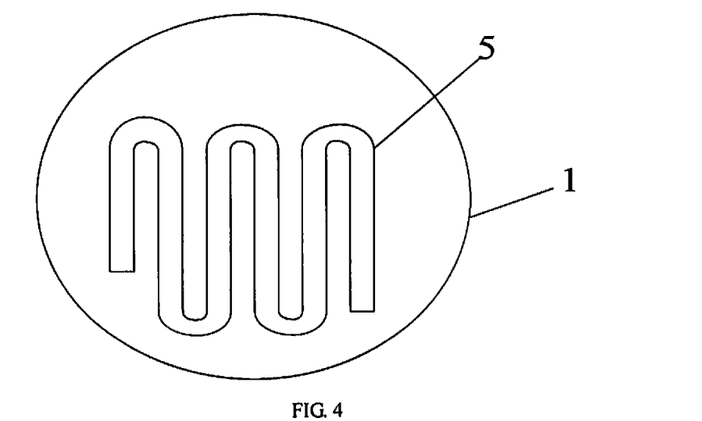
FIG. 4 is a top view of the wafer-level glass micro-flow channel according to an embodiment of the claimed invention.
Figure 5:
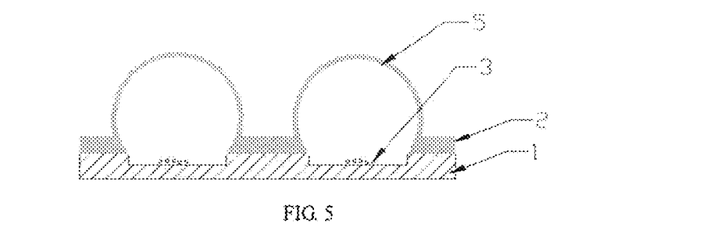
FIG. 5 is a sectional view of the wafer-level glass micro-cavity according to an embodiment of the claimed invention.
Figure 6:
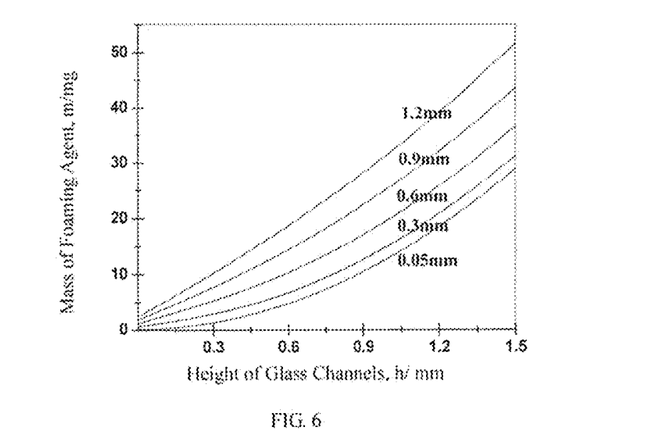
FIG. 6 shows the relationship between the mass of titanium hydride and the height of glass micro-flow channels (length of channel: 3 cm, foaming temperature: 1,123K, etched depth of silicon: 0.06 mm) at different opening half-width (half of silicon trench width) according to an embodiment of the claimed invention.
Figure 7:
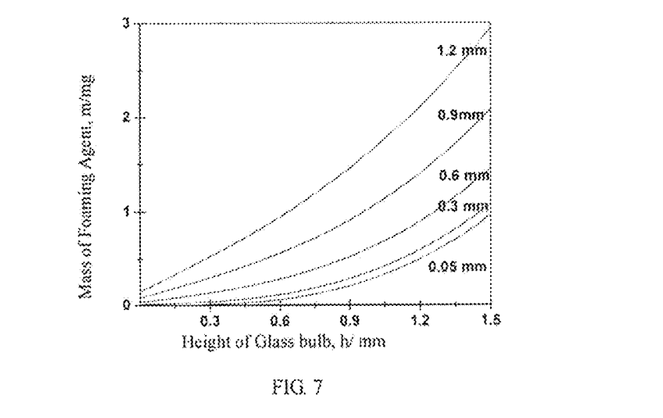
FIG. 7 shows the relationship between the mass of titanium hydride and the height of glass micro-flow channels (foaming temperature: 1,123K, etched depth of silicon: 0.06 mm) at different opening radius (the openings of silicon trenches are round) according to an embodiment of the claimed invention.
Figure 8:
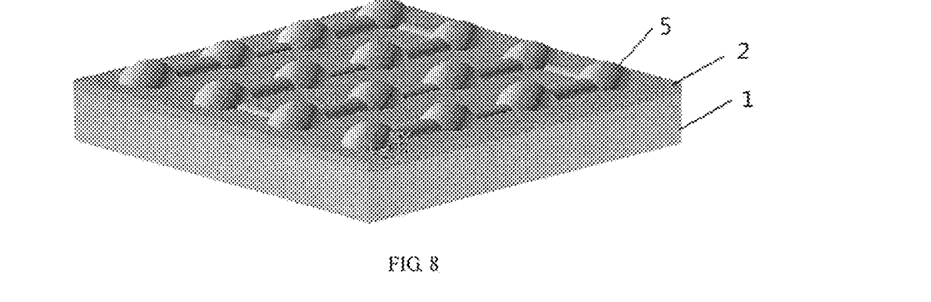
FIG. 8 is a structural diagram of spherical glass micro-cavities connected by micro-flow channels in accordance with the embodiment of FIG. 7.

The glass micro-cavities obtained in the claimed invention can be used to encapsulate other elements by bonding. The glass wafer with wafer-level glass micro-cavity arrays obtained in the claimed invention can be bonded with a piece of silicon wafer with an array of wafer-level MEMS elements, so as to obtain wafer-level encapsulated MEMS elements. In the claimed invention, scribing trenches can be reserved on the wafer; after foaming, the patterns can be scribed along the scribing trenches to obtain a number of different glass micro-cavities; in that way, wafer-level manufacturing of micro-cavities can be accomplished at lower cost. As shown in FIGS. 6 and 7, according to the thermolysis reaction kinetics of titanium hydride, the relationship between the molding height and the mass of titanium hydride can be calculated under given geometry and temperature conditions, and thereby the size of glass micro-cavities can be accurately controlled. The glass micro-flow channels in the present invention can also be used to produce micro-fluidic elements.

The invention claimed is:

1. A foaming process for preparing wafer-level glass micro-cavities, comprising the following steps:
    step 1: etching silicon trenches with 10-200 μm depth and a depth-width ratio of <2 on a silicon wafer through a silicon micro-machining process,
    step 2: placing powder of a high-temperature outgassing agent in the silicon trenches,
    step 3: bonding a piece of Pyrex7740 glass wafer to the silicon wafer by anodic bonding in air or vacuum, such that the silicon trenches form sealing cavities,
    step 4: heating up in air the silicon wafer bonded with the Pyrex7740 glass wafer to 820° C.-890° C., and holding for 3~5 min, so that the high-temperature outgassing agent releases gas due to heat and thereby positive pressure inside the sealing cavities is created, and the molten glass corresponding to the sealing cavities deforms and thereby glass micro-cavity structures corresponding to the silicon trenches are formed on the glass wafer, and cooling down to obtain wafer-level glass micro-cavities.

2. The foaming process for preparing wafer-level glass micro-cavities according to claim 1, wherein, the silicon trenches are silicon micro-flow channels, or independent silicon trench arrays, or silicon trench arrays, connected by micro-flow channels.

3. The foaming process for preparing wafer-level glass micro-cavities according to claim 1, wherein, the high-temperature outgassing agent is calcium carbonate, titanium hydride, magnesium carbonate, strontium carbonate, titanium hydride, or zirconium hydride.

4. The foaming process for preparing wafer-level glass micro-cavities according to claim 1, wherein, the silicon trenches have a depth of 50-100 μm and a depth-width ratio of <1.

5. The foaming process for preparing wafer-level glass micro-cavities according to claim 1, wherein, the silicon wafer and Pyrex7740 glass wafer are bonded by anodic bonding under the following process conditions: temperature: 400° C., voltage: 600V.

6. The foaming process for preparing wafer-level glass micro-cavities according to claim 1, wherein, the powder of high-temperature outgassing agent is placed in the silicon trenches by the following method that includes, mixing the high-temperature outgassing agent powder with volatile solvent, adding the mixture of high-temperature outgassing agent powder and volatile solvent into the silicon trenches (4), and then drying the mixture to remove the solvent.

7. The foaming process for preparing wafer-level glass micro-cavities according to claim 6, wherein, the volatile solvent is water or alcohol.

8. The foaming process for preparing wafer-level glass micro-cavities according to claim 1, wherein, the silicon trenches comprise silicon trench arrays connected by micro-flow channels, and the high-temperature outgassing agent is placed in one or more silicon trenches in the arrays.

9. The foaming process for preparing wafer-level glass micro-cavities according to claim 8, wherein, a width of the micro-channels is smaller than a particle diameter of the powder of high-temperature outgassing agent.

* * * * *